United States Patent [19]

Van Benthuysen et al.

[11] 3,947,800

[45] Mar. 30, 1976

[54] VARIABLE RESISTANCE CONTROL

[75] Inventors: John D. Van Benthuysen, Elkhart, Ind.; Thomas W. Flanders, Edwardsburg, Mich.

[73] Assignee: CTS Corporation, Elkhart, Ind.

[22] Filed: Feb. 4, 1974

[21] Appl. No.: 439,034

[52] U.S. Cl. .................. 338/163; 338/174; 338/202

[51] Int. Cl.[2] ........................................... H01L 10/34

[58] Field of Search ........... 338/174, 162, 163, 167, 338/175, 202, 118, 160, 75, 196, 197

[56] References Cited

UNITED STATES PATENTS

| | | | |
|---|---|---|---|
| 3,032,734 | 5/1962 | Zunker et al. | 338/163 |
| 3,205,466 | 9/1965 | Youngbeck et al. | 338/163 |
| 3,343,116 | 9/1967 | Budd et al. | 338/174 |
| 3,375,478 | 3/1968 | Benthuysen et al. | 338/174 |
| 3,421,133 | 1/1969 | Benthuysen et al. | 338/174 |
| 3,585,559 | 6/1971 | Rozema et al. | 338/174 X |
| 3,772,630 | 11/1973 | Falco | 338/174 |

*Primary Examiner*—Bruce A. Reynolds

[57] ABSTRACT

A variable resistance control comprises a resistance element supported on an electrically conductive supporting plate. A driver connected to the supporting plate is provided with a knob and with an integral stabilizing and particle excluding skirt. The ratio of the diameter of the stabilizing skirt to the diameter of the knob is relatively high. The stabilizing skirt rotatably engages the resistance element and encloses a contactor carried by the driver and prevents foreign particles from engaging the contactor. Indicator means integral with the stabilizing skirt and projecting beyond a truncated portion of the knob visually indicate the angular position of the contactor. The indicator means also engages a stop integral with the supporting plate and extending between the legs of the resistance element to arrest rotation of the contactor. Terminals provided with staggered ears are secured to the legs of the resistance element.

2 Claims, 3 Drawing Figures

VARIABLE RESISTANCE CONTROL

The present invention relates to electrical controls, and, more particularly, to a preset variable resistance control of the type provided with a movable contactor.

More and more types of electronic equipment require preset variable resistance controls having a wattage rating of one/eighth watt or less. Small preset controls ten and fifteen millimeters in diameter are currently available for use in such equipment. Certain types of preset variable resistance controls shown in U.S. Pat. Nos. 3,343,116 and 3,375,478 and assigned to the same assignee as the present invention describe a skirt concentric with the shaft and appended to one side of a rotatable knob. The skirt disposed near the shaft defines a nest between the skirt and the shaft for receiving the contactor and also stabilizes rotation of the knob. With the skirt disposed near the shaft, i.e., the skirt diameter being relatively small when compared to the diameter of the rotatable knob, maximum stabilization of the knob is not provided. It would, therefore, be desirable to provide a variable resistance control having a stabilizing means with a relatively large diameter with respect to the diameter of the rotatable knob.

In many electronic applications using preset variable resistance controls, it is important that the controls be provided with means for minimizing the amount of foreign particles entering the control. For example, after a control is mounted on a printed circuit board and partially dipped in molten solder for connecting the terminals of the control into a circuit, solder and flux splashing toward the contactor can cause malfunction of the control. In the controls shown in the above-identified patents, the contactor projects outwardly from the skirt and is exposed to the spashing solder and flux. It would, therefore, be desirable to provide a variable resistance control having a stabilizing skirt that minimizes passageways and shields foreign particles from the contactor.

To facilitate adjustment of many variable resistance controls, an indicator is often provided on the face of the rotatable member to indicate the angular position of the contactor, i.e., to indicate the amount of resistance in and out of the circuit. One type of indicator is described in the above-mentioned patents. Additionally, many variable resistance controls require a stop for limiting the angular rotation of the contactor. The provision of an indicator and a stop generally requires different component parts. It would, therefore, be desirable to provide a variable resistance control having a readily visible indicator wherein the indicator also arrests rotation of the contactor.

Accordingly, it is an object of the present invention to provide a new and improved variable resistance control having the various desirable features set forth above.

Another object of the present invention is to provide a new and improved variable resistance control having a relatively high ratio of the diameter of the stabilizing means to the diameter of the rotatable member.

A further object of the present invention is to provide a variable resistance control with a rotatable member having an integral stabilizing means extending toward the resistance element, the stabilizing means depending from the rotatable member in close proximity to the periphery of the rotatable member.

Another object of the present invention is to provide an improved variable resistance control having a rotatable member with a depending skirt enclosing the contactor thereby minimizing passageways for foreign particles to the contactor.

Still an additional object of the present invention is to provide a variable resistance control employing a support plate carrying a post, a rotatable member with a truncated portion, and a skirt integral with the rotatable member, an indicator integral with the skirt and projecting beyond the truncated portion of the rotatable member for providing an indicator means and for engaging the post to arrest rotation of the rotatable member.

Yet a further object of the present invention is to provide a variable resistance control having a U-shaped resistance element provided with a pair of legs wherein terminals are provided with folded, staggered ears received in corresponding notches in the legs for electrically connecting the resistance element into a circuit.

Further objects and advantages of the present invention will become apparent as the following description proceeds and the features of novelty characterizing the invention will be pointed out with particularity in the claims annexed to and forming a part of this specification.

Briefly, the present invention is concerned with a variable resistance control comprising a supporting plate, a resistance element mounted on the supporting plate, a collector spaced from the element and a contactor engaging the element and the collector. A rotatable member provided with an integral stabilizing means depending from near the periphery thereof encloses the contactor. The closed perimeter of the stabilizing means minimizes passageways for the ingress of foreign particles to the contactor. A relatively high ratio of the diameter of the stabilizing means with respect to the diameter of the rotatable member provides maximum stabilization of the rotatable member. An indicator projecting radially outwardly from the rotatable member indicates the angular position of the contactor and also engages a post integral with the supporting plate to arrest rotation of the contactor. The resistance element is provided with a pair of legs and terminals provided with staggered ears are received in corresponding notches provided in the legs and folded over the legs for electrically connecting the resistance element into a circuit.

For a better understanding of the present invention, reference may be had to the accompanying drawings wherein the same reference numerals have been applied to like parts and wherein.

Figure 1:
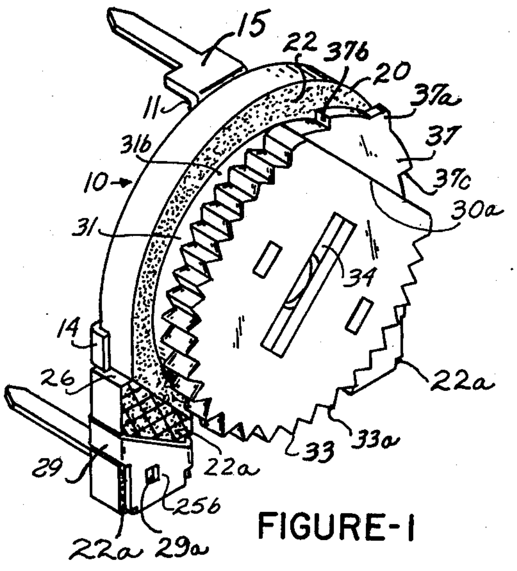
FIG. 1 is an isometric view of an improved variable resistance control built in accord with the present invention.

Referring now to the drawings, there is illustrated a variable resistance control, generally indicated at 10 comprising a supporting plate 11, a U-shaped resistance element 20, a rotatable member 30, and a contactor 40 constrained to rotate with the rotatable member 30 and wipably engaging the resistance element 20.

Figure 2:
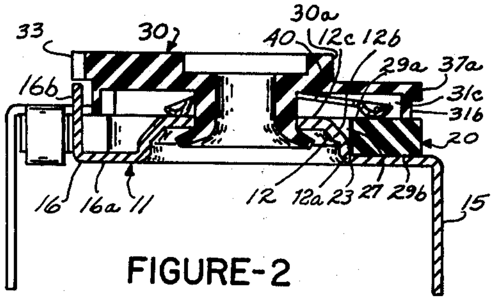
FIG. 2 is a sectional view of the control shown in FIG. 1.
Figure 3:
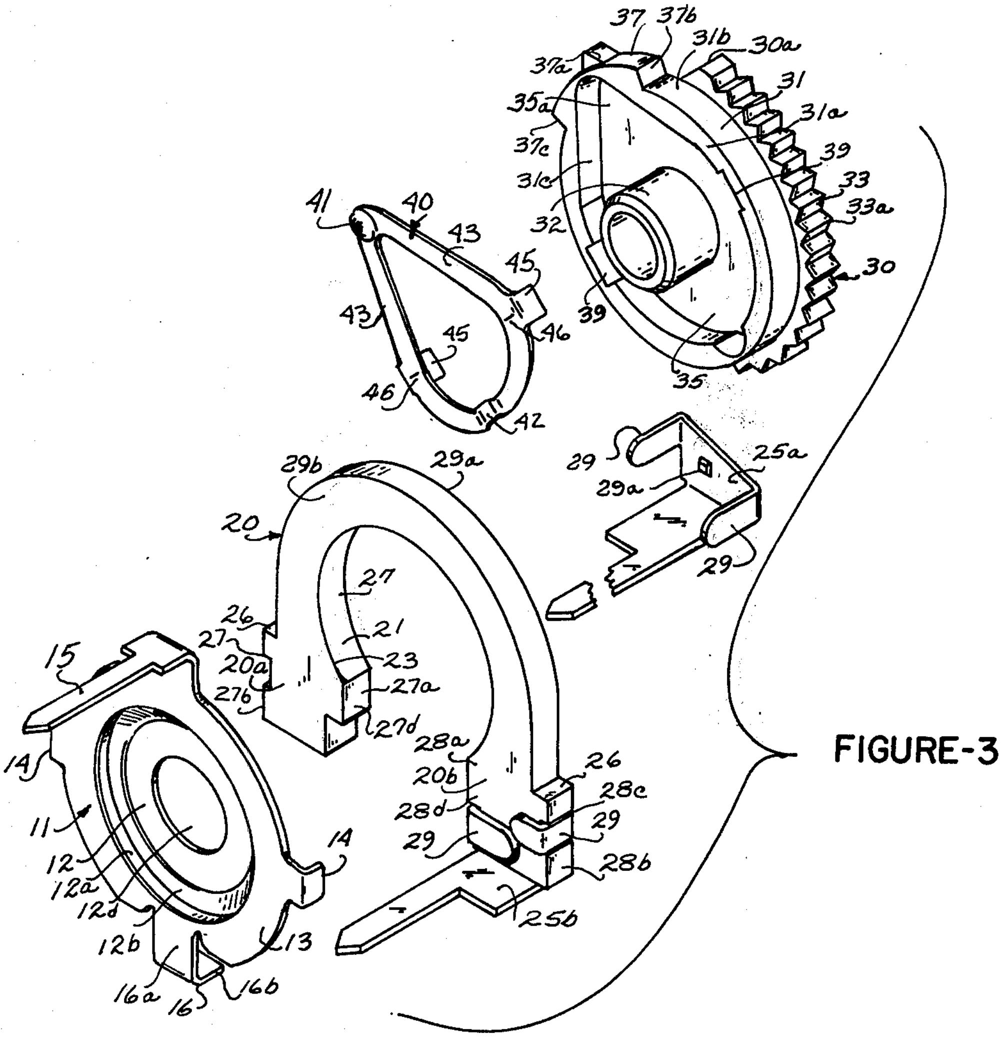
FIG. 3 is an exploded view of the variable resistance control shown in FIG. 1.

The supporting plate 11, preferably, comprises a one-piece sheet metal stamping of circular configuration having a collector 12 and a flat center portion 13 with a segment removed. The collector 12 preferably embossed from the flat center portion 13 of the supporting plate 11 extends inwardly thereof, as best seen in FIGS. 2 and 3 of the drawings. The outer periphery 12*a* of the collector is positioned adjacent to the edge 23 of an opening 21 of the U-shaped resistance element 20 for aligning the resistance element with the collector 12. If the collector 12 is not embossed from the center portion 13, then other means such as not shown locating ears can engage the lower edge 23 of the opening 21. As best shown in FIG. 2, a sufficient gap is provided between the upper edge 27 of the opening 21 and the collector by forming a bevel 12*b* between the outer periphery 12*a* and the top surface 12*c* of the collector 12. The gap should be sufficient to withstand the ground test voltage applied to the control 10 after assembly.

The resistance element 20 defined by an arcuate portion and a pair of spaced legs 20*a*, 20*b* comprises a base of insulating material having a resistance film 22 deposited on one side thereof defining an arcuate resistance path. Conductive pads 22*a* as shown in FIG. 1 of the drawings are deposited on each of the legs in overlapping relationship with the ends of the resistance film 22.

To prevent relative rotation between the U-shaped resistance element 20 and the supporting plate 11, a pair of ears 14 are disposed along the periphery of the flat center portion 13 of the supporting plate 11 and engage suitable notches 26 in the resistance element 20. The ears 14 not only prevent relative rotation between the resistance element 20 and the supporting plate 11 but also function as stop ears for restricting outward movement of the legs 20*a*, 20*b* with respect to each other. A terminal 15 integral with the supporting plate 11 and extending normal from the periphery of the flat center portion 13 connects the collector 12 into an electrical circuit.

A pair of terminals 25*a*, 25*b* are secured to the legs 20*a*, 20*b* of the U-shaped resistance element 20 for connecting the resistance film 22 into an electrical circuit. Each of the legs of the resistance element are defined by an inner edge 27*a*, 28*a* and an outer edge 27*b*, 28*b*. A pair of outer notches 27*c*, 28*c* are provided in the outer edges of the legs and a pair of shoulders 27*d*, 28*d* projecting from the inner edges of the legs define a pair of inner notches. Each of the terminals 25*a* and 25*b* is provided with a pair of staggered clinching ears 29 folded over each of the respective legs 20*a* and 20*b* securing the terminals thereto. By staggering the ears of the terminals and the corresponding notches in the legs, longer ears can be employed for securing the terminals to the legs of the resistance element without causing the folded ears to overlap each other thereby increasing the clamping pressure between the terminals and the conductive pads 22*a* deposited on the legs. Moreover, protuberances 29*a* project inwardly from the terminals and are embedded in the conductive pad disposed on each leg for electrically and mechanically connecting the terminals to the conductive pads and to the resistance element.

The rotatable member or driver 30 comprises a knob 33 defined by the crests 33*a* of the undulations and preferably is molded of an electrically nonconductive heat deformable material such as nylon. A hollow stub shaft 32 extending inwardly of and integral with the rotatable member 30 is journaled in an aperture 12*d* provided in the collector 12. The parts of the variable resistance control 10 therefore can be readily held together after assembly by inserting the end of the stub shaft 32 into the aperture 12*d* of the collector 12 and flaring and swaging the end of the shaft 32 projecting outwardly from the collector 12. Since the collector 12 is coaxially mounted with the resistance film 22, the rotatable member 30 is also in axial alignment with the resistance film 22 deposited on the base.

According to the present invention, a stabilizing means or annular skirt 31 having an outer edge or peripheral lip 31*a*, an outer circumferential surface 31*b*, and an inner circumferential surface 31*c* depends from and is integral with the knob 33. The peripheral lip 31*a* of the stabilizing means 31 forms a bearing surface and rotatably engages the top surface 29*a* of the resistance element 20. The diameter of the skirt is greater than the inner diameter but less than the outer diameter of the arcuate portion of the arcuate resistance path, thereby providing an arcuate resistance path portion between the terminals 25*a*, 25*b* and exterior of and unscrubbed by the skirt 31. Preferably the stabilizing means or annular skirt 31 should not be substantially equal to the diameter of the resistance path since such relationship causes the skirt to scrub the conductive pads. Usually the resistance path is of suitable hardness to prevent change to the resistivity when a usual small number of revolutions are made with the rotatable member 30. The conductive pads however generally are of a softer material than the resistance path and extended scrubbing of the conductive pads with the annular skirt 31 could result in removal of the conductive material from the conductive pads and transfer of such conductive material onto the resistance path thereby drastically altering the resistivity thereof. Moreover, removal of the conductive material from the conductive pads 22*a* will substantially increase the minimum resistance obtainable when the contact is at the end of the resistance path adjacent to or engaging one of the conductive pads. It is to be understood that if the conductive pad is of suitable hardness, there is then little chance of removal of the material and therefore no transfer of the material would result.

The diameter of the stabilizing means defined by the outer circumferential surface of the arcuate portion of the stabilizing means 31*b* is relatively large with respect to the diameter of the knob 33 resulting in a high degree of stabilization of the knob 33. Specifically, in the present invention the ratio of the diameter of the stabilizing means to the diameter of the rotatable knob is 82.0 percent. By contrast, in the control shown in U.S. Pat. No. 3,375,478 the ratio of the diameter of the skirt to the diameter of the rotatable knob is 56.4 percent resulting in a much lower stabilization factor than in the control of the present invention. Preferably and in accord with tests conducted, the ratio should be in excess of 60 percent with the diameter of the knob greater than the diameter of the skirt.

In accord with the present invention, as best seen in FIGS. 2 and 3, the stabilizing means 31 encloses the contactor 40 and provides a continuous barrier protecting the contactor 40 from foreign particles. The inner circumferential surface 31*c* of the stabilizing means and the outer circumferential surface 31*b* connected by the peripheral lip 31*a* enclose the contactor 40. A pair of diametrically opposed recesses 39, as seen in FIG. 3, are provided in the stabilizing means 31. To constrain the contactor 40 to rotate with the rotatable member 30, a pair of diametrically opposed lugs 45 integrally connected to a pair of arms 43 of the contactor 40 are disposed within the opposed recesses 39 of the rotatable member 30. The contactor 40, having a pair of contacts 41 and 42, is nestedly received in an annular cavity 35 formed by the shaft 32 and the inner circumferential surface 31*c* of the stabilizing means 31. The contact 41 is disposed a greater distance from the axis of the shaft 32 than the contact 42 of the contactor 40 for making electrical engagement with the resistance film 22, the contact 42 engaging the collector 12. The arms 43 of the contactor 40 are preformed into a V cross section by forming a crease 46 extending through both arms for biasing the contacts 41 and 42 against the film 22 and the collector 12.

In accord with the present invention, an indicator 37 having a pointer portion 37*a* and stops 37*b* and 37*c* projects radially outwardly from the stabilizing means. As seen in FIG. 3, the indicator 37 defines a portion 35*a* of the cavity 35 for receiving the contact 41 of the contactor 40. The pointer portion 37*a* extends radially outwardly from the indicator 37 and indicates the angular position of the contact 41, i.e., the amount of resistance in the circuit. Thus, as the knob 33 and the contactor 40 are rotated, the pointer portion 37*a* of the indicator 37 indicates the point of engagement of the contact 41 on the resistance film 22. The rotatable member 30 contains a truncated portion defined by the boundary 30*a* and the indicator 37 projects beyond the truncated portion to facilitate visual observation of the indicator 37.

The supporting plate 11 contains an L shaped post 16 integral therewith and extending between and beyond the legs 20*a* and 20*b* of the U-shaped resistance element 20 adjacent to the skirt 31. The post 16 specifically comprises a leg 16*a* extending radially outwardly from the center portion 13 of the supporting plate 11 and a leg 16*b* perpendicular to the leg 16*a* and extending toward the rotatable knob 33. The indicator 37 engages the post 16 upon rotation of the knob 33, specifically the stop 37*b* of the indicator 37 engages the post 16 during counterclockwise rotation and the stop 37c engages the post 16 during clockwise rotation of the knob 33 for halting rotation of the rotatable member.

In order that the variable resistance control 10 can be quickly adjusted with a tool such as a screw driver, a slot 34 is provided on the front surface of the rotatable member. The undulated periphery of the knob 33 manually facilitates rotation of the rotatable member without a tool.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent of the United States is:

1. A variable resistance control comprising an electrically conductive supporting plate, a U-shaped resistance element mounted on the supporting plate, the element comprising an electrically nonconductive base having an arcuate portion and a pair of spaced legs and an arcuate resistance path on one side of the base, the other side of the base engaging the supporting plate, a collector integral with the supporting plate, a driver rotatably secured to the supporting plate, a contactor wipably engaging the resistance element and the collector and constrained to rotate with the driver, the resistance element being sandwiched between the driver and the supporting plate, an annular skirt depending from the driver and defining a cavity, the skirt engaging the resistance element, the contactor being disposed within the cavity defined by the skirt, a knob integral with the skirt, the diameter of the knob being larger than the diameter of the skirt, a post integral with the supporting plate and projecting upwardly between the legs of the resistance element and intersecting a plane of the base, the post being disposed outside of the skirt, and stop means integral with and projecting radially outwardly from the driver and engageable with the post for limiting angular rotation of the driver and the contactor, said stop means providing a portion of the skirt enclosure and lying above the plane of the base, the portion of the contactor wipingly engaging the resistance element being in registry with the stop means visually indicating the angular position of the contactor.

2. The control of claim 1, wherein each of the legs has an inner edge and an outer edge, the outer edge of each leg is provided with an outer notch, a shoulder projects from the inner edge of each of the legs and defines an inner notch, a terminal is secured to each of the legs, and a pair of ears integral with each of the terminals, said ears being in a staggered and unoverlapped relationship, one of the ears is received in the outer notch, the other of the ears is received in the inner notch adjacent to the shoulder, the ears of each terminal being folded around the leg toward each other.

* * * * *